United States Patent
Tekletsadik

(10) Patent No.: US 8,862,193 B2
(45) Date of Patent: Oct. 14, 2014

(54) SUPERCONDUCTING FAULT CURRENT LIMITER

(75) Inventor: Kasegn D. Tekletsadik, Middleton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 877 days.

(21) Appl. No.: 12/981,051

(22) Filed: Dec. 29, 2010

(65) Prior Publication Data

US 2012/0275067 A1    Nov. 1, 2012

(51) Int. Cl.
*H02H 9/00*    (2006.01)
*H01L 39/16*    (2006.01)

(52) U.S. Cl.
CPC .............. *H01L 39/16* (2013.01); *Y10S 505/85* (2013.01)
USPC .............. 505/220; 505/850; 505/236; 361/19

(58) Field of Classification Search
USPC ........ 505/220, 850, 236, 237, 230; 361/8–10, 361/19
See application file for complete search history.

(56) References Cited

U.S. PATENT DOCUMENTS

2010/0273657 A1*  10/2010  Martchevskii ................ 505/230
2011/0281735 A1*  11/2011  Mumford et al. ............. 505/237

FOREIGN PATENT DOCUMENTS

| EP | 2192629 A1 |   | 2/2010 |   |
| FR | 2192629 A1 | * | 6/2010 | ............. H01L 39/16 |
| FR | WO 2010/060597 A1 | * | 6/2010 | ............. H01L 39/16 |

* cited by examiner

*Primary Examiner* — Stanley Silverman
*Assistant Examiner* — Kallambella Vijayakumar

(57) ABSTRACT

A connector assembly of a superconducting fault current limiter includes a first superconducting tape element, an electrical connector electrically coupled to the first superconducting element at a first region of the electrical conductor, and a second superconducting tape element electrically coupled to the electrical connector in a second region of the electrical connector. The electrical connector comprises a unitary structure. The first superconducting tape element, the electrical connector, and the second superconducting tape element comprise may comprise a layer.

18 Claims, 5 Drawing Sheets

SUPERCONDUCTING FAULT CURRENT LIMITER

FIELD

This invention relates to current control devices, more particularly, to an apparatus for fault current limiting.

BACKGROUND

Fault current limiters are used to provide protection against current surges, for example in a power transmission network. Superconducting Fault Current Limiters (SCFCL) are a class of devices that operate at a cryogenic temperature and are typically used in electrical transmission or distribution lines that are subjected to high voltages and high currents. In a resistive SCFCL, the current passes through the superconductor component of the SCFCL such that when a high fault current begins, the superconductor quenches in that it becomes a normal conductor and the resistance rises sharply and quickly.

In particular, the core of a SCFCL device may consist of several superconducting elements that are interconnected in series and parallel using non-superconducting connectors, which may dissipate power and increase cryogenics thermal load. In a normal operating mode, the SCFL device is cooled to cryogenic temperatures in order for the superconducting elements, such as tapes, to enter the superconducting state. Under a non-fault state, current passes through the superconducting tapes and into connector regions that exhibit normal-state (that is, non-superconducting) current conduction, which may be composed of conventional metals. When a current surge takes place along a transmission line, the current may enter the SCFCL at which point it travels through the superconducting elements. If the current surge exceeds a critical value in the superconducting tapes, the superconducting material may transform into a normal conductor (i.e. quench). Once in the normal conducting state, the superconductor material acquires a resistance to current which may limit the current conducted through the SCFCL to acceptable levels, thereby regulating the current conducted along the transmission lines.

SCFCLs that are under active development include, among others, systems using magnesium diboride wire, Yttrium Barium Copper Oxide (YBCO) tape, or Bismuth Strontium Calcium Copper Oxide (BSSCO) materials, which are cooled to below their respective superconducting transition temperatures ($T_c$) in order to function as designed. YBCO and BSSCO-based devices are attractive because the $T_c$ in typical commercial materials is in the range of 90°-105° K, allowing SCFCL devices to operate using relatively inexpensive liquid nitrogen or boiling nitrogen cooling.

In known SCFCL devices that use tape-type structures, a superconducting layer may be laminated with other non-superconducting layers that include metal cladding. The composite tape may be joined to other tapes to form an SCFCL device. In particular, a series of superconducting tapes can be coupled using electrically conductive connectors having normal conductivity, such as metallic elements. For example, superconducting tapes may be soldered to metal connectors that form interconnections between the tapes. However, this type of configuration is prone to developing hot spots caused by highly non-uniform current distributions, and to connection power losses.

Moreover, significant power losses may occur when current passes between superconducting and non-superconducting regions. In some configurations, an SCFCL design may contain many hundreds of connection points between superconducting and non-superconducting elements in which hundreds of watts of steady state power are lost. Accordingly, it will be apparent that improvements are desirable over known SCFCL systems.

SUMMARY

In one embodiment, a connector assembly of a superconducting fault current limiter includes a first superconducting tape element, an electrical connector electrically coupled to the first superconducting element at a first region of the electrical conductor, and a second superconducting tape element electrically coupled to the electrical connector in a second region of the electrical connector. The electrical connector comprises a unitary structure. The first superconducting tape element, the electrical connector, and the second superconducting tape element may comprise a layer.

In another embodiment, a superconducting fault current limiter (SCFCL) includes a cryogenic cooling system and a current limiter module arranged to receive cooling from the cryogenic cooling system. The current limiter module may include a stack of layers that form a plurality of parallel current conduction paths. Each layer may comprise a plurality of superconductor tapes arranged in series that are electrically coupled to one another using a unitary metallic connector, wherein a first tape is coupled to the metallic connector in a first region of the connector, and wherein the second tape is coupled to the metallic connector in a second region of the connector.

BRIEF DESCRIPTION OF THE DRAWINGS

For a better understanding of the present disclosure, reference is made to the accompanying drawings, which are incorporated herein by reference and in which:

FIG. 2b is a cross-sectional view of the connector assembly of FIG. 2a;

FIG. 2c is a cross-sectional view of a steady state mode current flow in the connector assembly of FIG. 2a;

FIG. 2d is a cross-sectional view of a fault mode current flow in the connector assembly of FIG. 2a;

FIG. 3b is a cross-sectional view of steady state current flow in a first part of the connector of FIG. 3a;

FIG. 3c is a cross-sectional view of steady state current flow in a second part of the connector of FIG. 3a;

FIGS. 5b and 5c are plan views of current distribution in the connector of FIG. 5a.

DETAILED DESCRIPTION

To address some of the deficiencies in the aforementioned SCFCLs, embodiments are described herein that provide improved SCFCL architecture and performance.

Figure 1A:
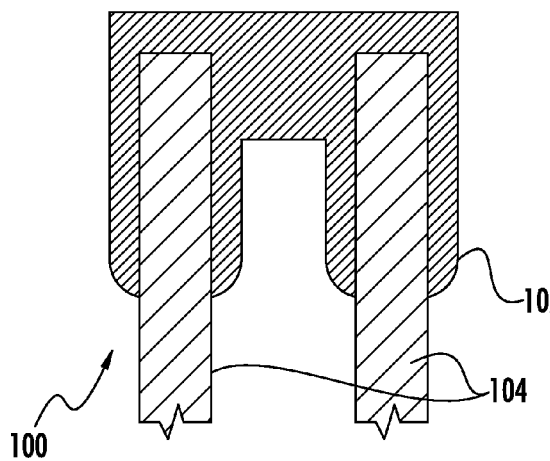
FIGS. 1a and 1b are plan views of connector embodiments.

FIG. 1. illustrates a plan view of an embodiment of an SCFCL connector arrangement 100. In this arrangement, a unitary copper connector 102 connects separate superconducting tapes 104. The tapes 104 may contain a known superconducting material, such as YBCO, BSCCO, or other superconductor. The superconducting (SC) material may have a critical temperature $T_c$ above 77 K, such that the tapes may operate in the superconducting state when cooled by liquid nitrogen. However, other tape materials having lower $T_c$ may be used in arrangement 100.

In some embodiments, the tapes 104 may have a laminated structure that includes a superconducting (SC) layer and normal (non-superconducting) metal top and/or bottom layers. Unless otherwise noted, the terms "top" and "bottom," as used in conjunction with superconducting laminated stacks, are arbitrary designations that generally refer to outer layers on opposite sides of a laminated stack. The term "superconducting," or "superconductor" when used herein in reference to a tape or material, may designate such tape or material that generally exhibits superconductivity when deployed in an SCFCL under designed operating conditions. These designed operating conditions may include operating under cooling from liquid nitrogen or boiling nitrogen, which may produce an ambient of about 77° K. However, such superconductor may undergo a transition to normal state (non-superconducting) electrical conductivity when subject to an event, such as excessive electrical current or excessive temperature. Thus, for example, a YBCO-type material may be referred to as a superconductor even when not in its superconducting state.

In some embodiments, both top and bottom layers of a laminated tape may be normal state metals. In some embodiments a top layer may be a normal state metal having low electrical resistivity, such as copper, and a bottom layer may be a normal state metal having higher resistivity, such as a steel alloy.

Figure 1B:
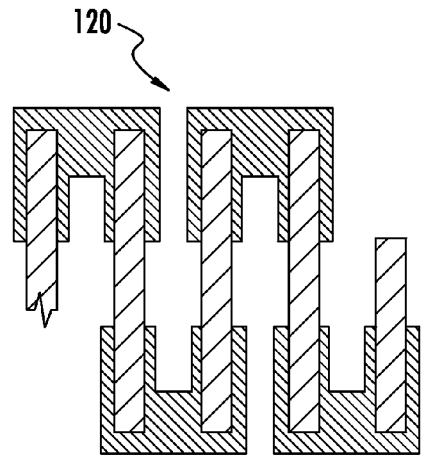

In the embodiment of FIG. 1, the connector may have a generally U-shaped arrangement, and tapes 104 may be configured to overlap the connector as shown. However, in other embodiments connectors may comprise alternative shapes. In particular, the tapes 104 may each be coupled at a planar interface in the overlap region to a connector 102. The U-shaped connector arrangement 100 of superconducting tapes 104 may be repeated, such that a chain of connectors that interconnect a corresponding chain of superconducting tapes is formed. The chain may define a serpentine structure 120 as depicted in FIG. 1b, which may serve to increase the voltage that may be applied across the SCFCL. In this manner, connector assembly may provide a smooth path for a large electrical current to flow from superconducting tapes into and out of electrical connectors. Under standard (or "steady state") operation of an SCFCL (that is, when the tapes 104 are in a superconducting state), each tape 104 may carry a current in the range of 250 to 1000 Amperes.

Figure 2A:
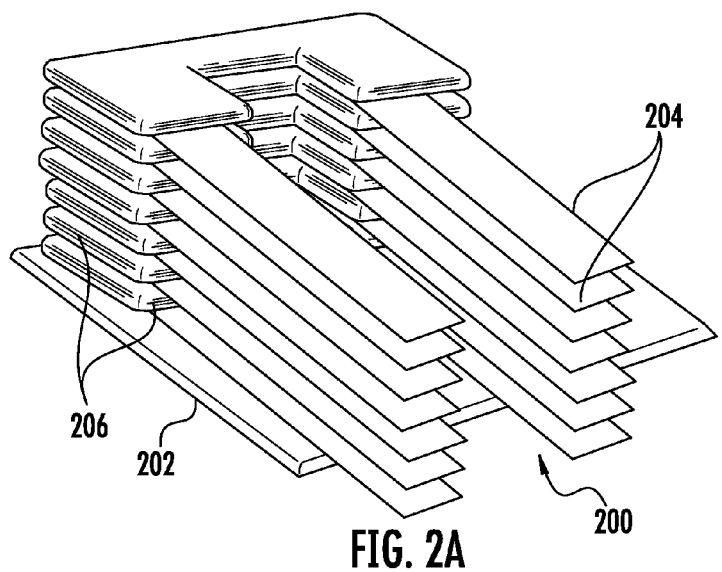
FIG. 2a is a perspective view of a connector assembly embodiment; cross-sectional view of a known selective.

In some embodiments, the connector configuration of FIG. 1 may be repeated in vertical fashion in which a series of connectors 100 are arranged in stacks as illustrated in FIG. 2a. FIG. 2a depicts an SCFCL connector stack arrangement 200 according to an embodiment in which six layers of superconducting tapes 204 are electrically connected in a series and parallel fashion using stacked connectors 206, which may be affixed to a base 202. In the SCFCL configuration of FIG. 2a, each tape 204 may be connected to a metal connector 206 at both a top 204a and bottom 204b interface. In some embodiments, the connector arrangement within a layer may form a serpentine structure having multiple connectors as depicted in FIG. 1.

Figure 2B:
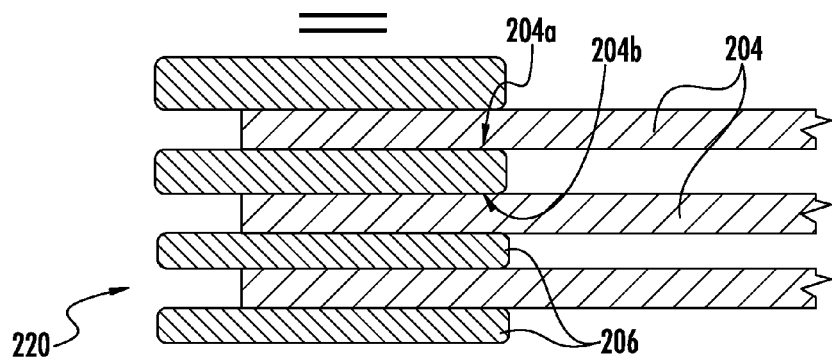

FIG. 2b illustrates a cross-sectional view of a SCFL arrangement 220, which may represent a portion of arrangement 200. Interfaces 204a and 204b of each tape 204 may be affixed to respective metal connectors disposed on the top and bottom of the tape. For example, interfaces 204a and 204b may each be a metal outer layer of a layer stack in which the superconducting layer (not shown) comprises an inner layer, as discussed above. The interfaces 204a and 204b may be joined to connectors 206 by soldering or other convenient techniques that provide an electrically conductive path between tapes 204 and connectors 206. The stacked configuration of SCFCL arrangement 200 may provide the capability for high current transmission in standard mode, while providing a means to limit current surges in a fault mode, as described further below with respect to FIGS. 2c and 2d. In addition, embodiments of the arrangement 200 reduce the resistance loss over conventional SCFCLs.

In some embodiments, the connector stack arrangement 200 forms a current limiter module of an SCFCL installation that may contain many such modules. During operation of the SCFCL, the modules may be arranged in a chamber and may be cooled by a cooling system in order to place the tapes 204 in their superconducting state. Cooling systems may include systems to provide liquid nitrogen, boiling liquid nitrogen, or may comprise other cryogenic cooling means.

Figure 2C:
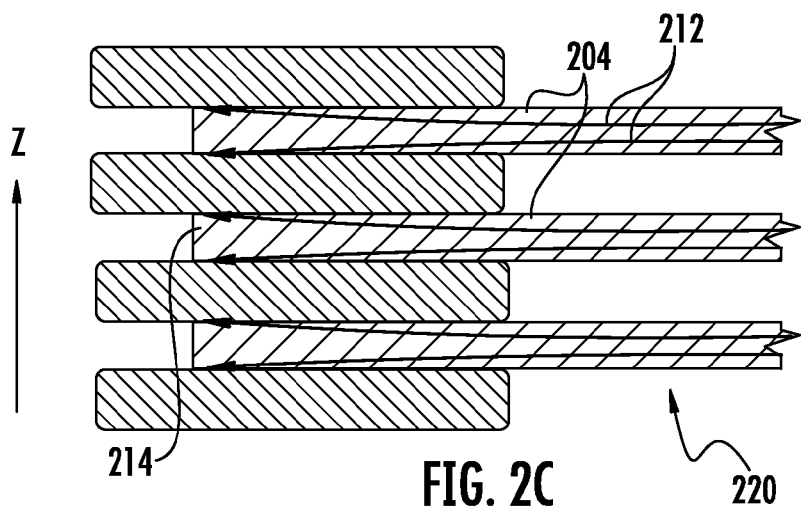

FIG. 2c depicts cross-section of the SCFCL stack 220 of FIG. 2b under steady state operating mode. During steady state operation, SCFCL stack 220 may operate as part of an SCFCL installation to transmit current in series with power transmission lines (not shown). As noted above, in standard operation, each SC tape element 204 is in the superconducting state and is configured to transmit electrical current without resistance. Accordingly, current 212 entering stack 220 from external power lines is conducted through the SC tape elements without significant losses due to resistive heating ($I^2R$ losses). Moreover, current 212 may travel through many tape elements 204 that are arranged in parallel fashion in which each layer of tapes conducts a portion of the total current. Current 212 may follow the general path illustrated in FIG. 2c in which the current extends within a tape 204 to near an end 214 of each tape 204 before entering the connector elements 206. This is because the current meets no resistance within the superconducting tape and only exits toward the end of each tape into the less conductive connector. When current enters connectors 206 there may be substantial power losses due to $I^2R$ heating when the current travels through the metallic connectors. In the embodiment of FIG. 2c, all the current transfer may occur between the SC tape and the connector with no current flowing between connectors. This may help reduce hot spot formation and non-uniformities.

Figure 2D:
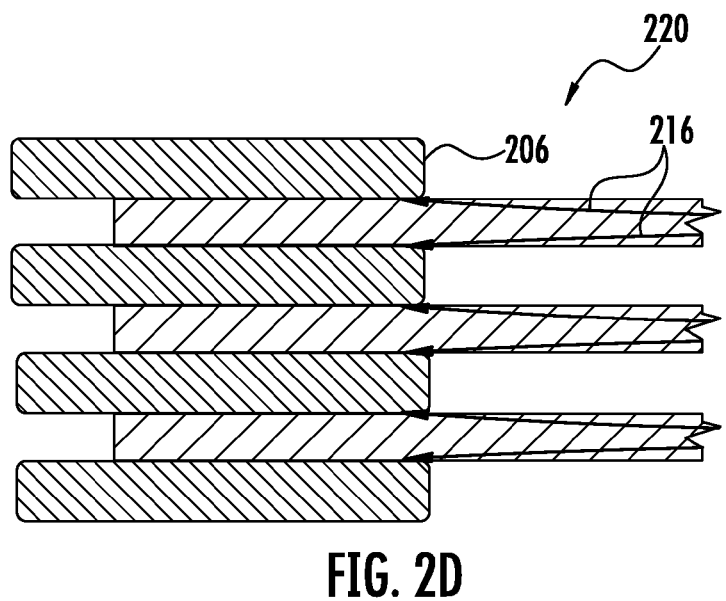

Under fault mode operation, SCFCL stack 200 is designed to limit excessive current, as illustrated in FIG. 2d. During fault mode, a current surge within a power line may be transmitted through tapes 204. If the current surge exceeds the critical current $I_c$ characteristic of the superconducting material of the tape 204, the superconducting material may transform into a normal conductor according to known mechanisms. Once becoming a normal conductor, the tape 204 may exhibit significant resistance to current flow. Known superconducting materials such as YBCO and BSSCO typically exhibit higher normal state electrical resistance than highly conductive metals, such as copper, silver, or gold, for example. Accordingly, current 216 exiting the tapes 204 and entering connectors 206 may tend to enter the connectors at the first edge of the metallic connector, as illustrated in FIG. 2d. Accordingly, the total current transmitted though SCFCL 200 during a current surge may be limited by the transition of tapes 204 to normal state conduction.

In some embodiments, a series of parallel electrical currents may be established in a series of connector assembly layers such that current travels horizontally within a layer and not vertically between layers. In particular, the U-shaped connector design depicted in the figures facilitates current flow continuity within a layer and hence eliminates hot spots otherwise caused by non-uniform current distribution. In the example of FIGS. 2c, 2d, the current may exit each tape 204 and enter a pair of adjacent connectors 206 disposed above or below the tape as illustrated. The current in the adjacent connectors may then return into a single tape 204 (not shown) that is disposed in the same vertical position (along the z-direction). Referring also to FIG. 1b, the current may travel through a set of tapes 204 arranged in series such that current in a first tape propagates in successive tapes that lie in the same plane as the first tape. Thus, a series of parallel currents may propagate in a generally planar fashion throughout an SCFCL using the configuration of connector 200.

Figure 3A:
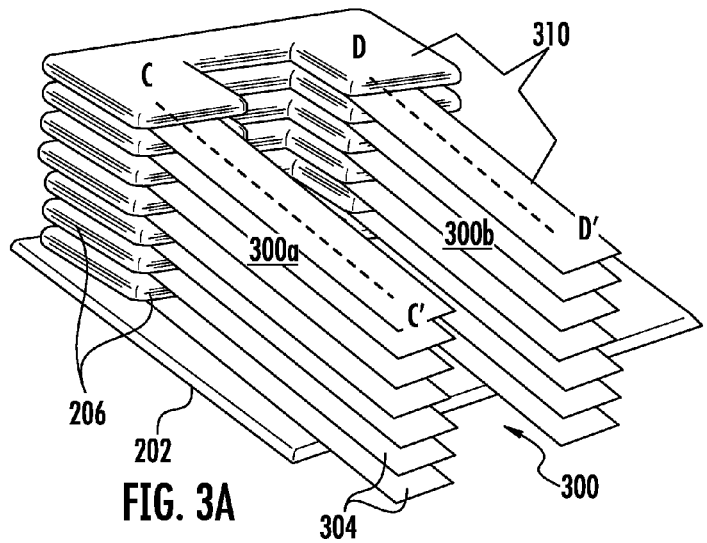
FIG. 3a is a perspective view of a connector assembly embodiment.
Figure 3B:
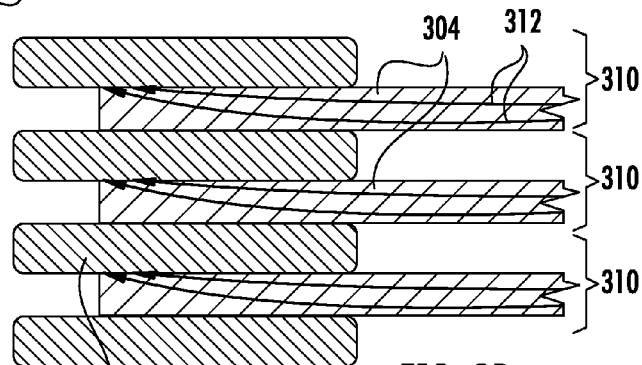
Figure 3C:
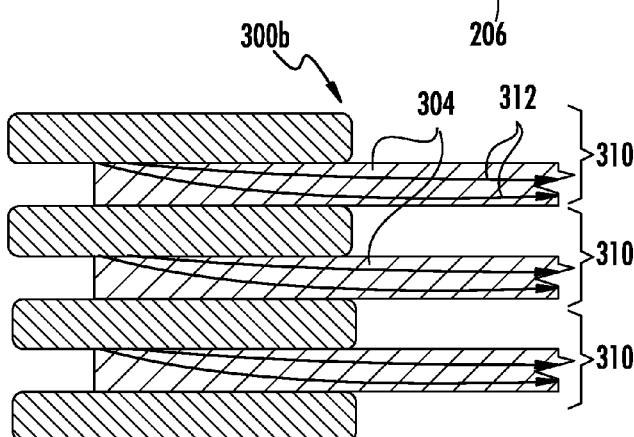

FIG. 3a depicts another SCFCL assembly embodiment in which layers 310 are arranged to conduct current within each layer and not between layers. FIGS. 3b and 3c depict exemplary current flows in respective cross-sections C-C' and D-D' along the respective "arms" of the connector assembly 300a and 300b. The current 312 may travel within the superconductor tape 304 when operating under normal conditions and into an adjacent connector layer 206. In FIG. 3b, current 312 in each layer 310 of arm 300a passes from a tape element 304 into a connector 206 by deflecting upward to a connector portion disposed above the tape element. FIG. 3c illustrates an exemplary arrangement in which the current 312 in each layer 310 of arm 300b passes from the connector element 206 downwardly into a tape element 304 that may be disposed in the same layer 310 as its counterpart in FIG. 3b. Thus, the current remains within a layer 310 during its course through a first tape element 304 into a connector element 206 and through a second tape element 304.

Figure 3D:
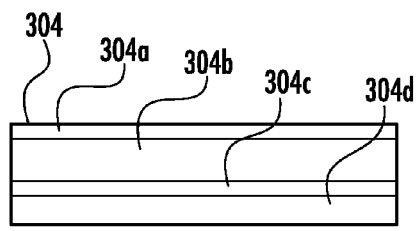
FIG. 3d is a cross-section of an exemplary superconductor tape.

FIG. 3d depicts one embodiment of a superconducting tape element 304 in which a series of layers are arranged in a stack. Layer 304b may be a superconducting layer, while layer 304a may be a high conductivity metal layer, such as a silver layer. Layer 304c may be another conductor, such as a semiconductor or metal layer and layer 304d may be a higher resistivity metal layer, such as a steel or other metal alloy layer. Because layer 304d may be much more resistive than layer 304a, current entering a connector 206 from a tape 304 may tend to deflect upwards through the high conductivity layer as illustrated in FIG. 3b.

In some embodiments, in an SCFCL stacked connector assembly, such as assembly 300, each tape 304 on each arm may be arranged with its layers oriented in the same direction. Thus, a stack of layers 304 may have the silver layer 304a as the top layer (as viewed in FIGS. 3b-d) in each connector assembly layer 310. Accordingly, current leaving a connector 206 may tend to deflect downwards because the high conductivity layer 304a is disposed immediately under the connector 206.

Figure 4A:
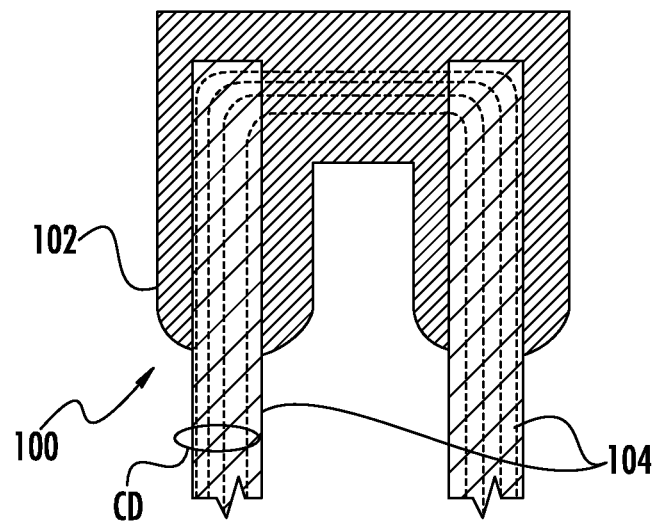
FIGS. 4a and 4b are plan views of current distribution in the connector of FIG. 1.
Figure 4B:
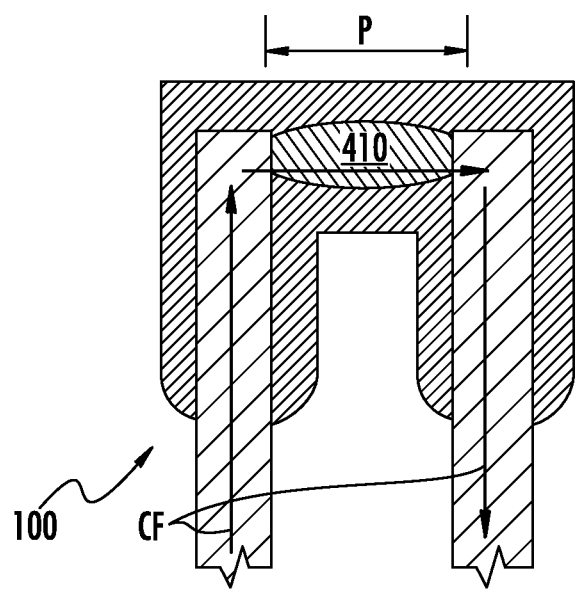

Although SCFCL 200 may provide zero resistance to current flow in SC tapes 204 while operating under standard conditions, and the unitary connector structure may improve current flow, significant power losses may still occur due to resistance to current flow when the current passes through the normal-metal connectors 206 between superconducting tapes. FIGS. 4a and 4b illustrate current flows within connector 100 of FIG. 1, illustrating features that may lead to power loss. FIG. 4a depicts a plan view that shows current paths CD within connector 100, illustrating that a relatively uniform current flow between tapes 104 across a connector 102. However, as illustrated in FIG. 4b, this relatively uniform current flow may nevertheless produce resistive heating in an area 410 that extends between the tapes 104. In some embodiments, P may be on the order of a few centimeters. In an SCFCL assembly having about 300 connection points, a spacing of a few centimeters between superconducting elements produces on the order of 10 meters current path through normal metal connector, such as copper. This may result in around 240 W of steady state power losses for SCFCL assemblies operating in a 138 kV, 3000 A system.

Figure 5A:
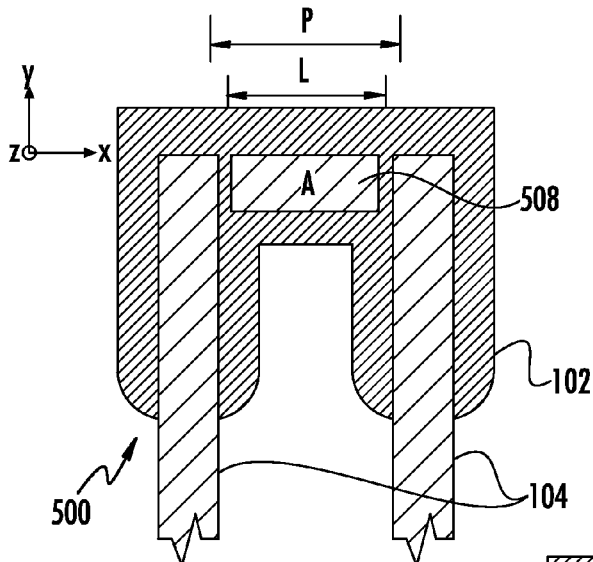
FIG. 5a is a plan view of another connector embodiment.
Figure 5B:
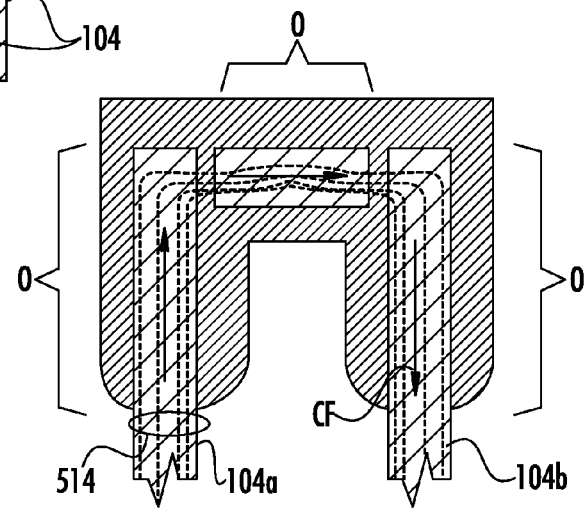
Figure 5C:
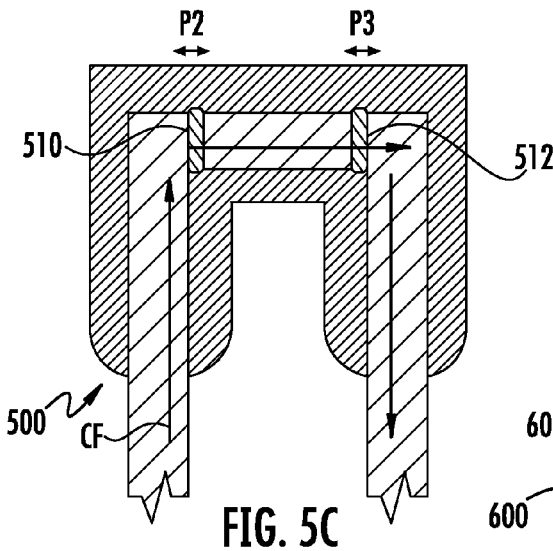
Figure 6:
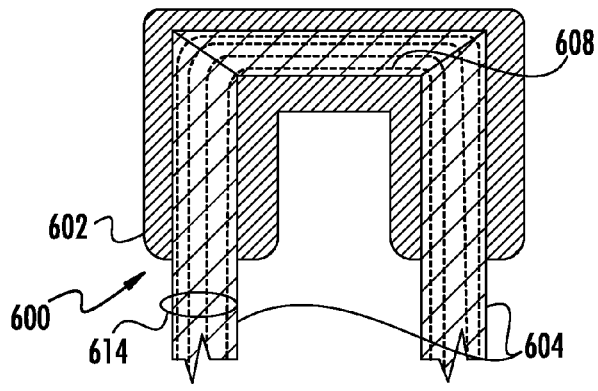
FIG. 6 is a plan view of a further connector embodiment.

Embodiments of SCFCL 200 may provide reduced power losses due to connector resistance (as well as hot spots) by reconfiguring SCFCL connector components, as illustrated in FIGS. 5-6.

FIG. 5a depicts another SCFCL connector embodiment 500 in which a "bridge" tape 508 is disposed between tapes 104. Connector 500 may be the same as connector 100 in other respects. As depicted in FIG. 5a, connector tape 508 may span a large portion of the lateral separation P between tapes 104. Connector tape 508 and tapes 104 may all lie in the same plane. In some embodiments, connector tape 508 has the same material(s) and structure as tapes 104, except for its difference in overall lateral dimensions (in the x-y plane as viewed in FIG. 5a) as compared to tapes 104. In particular embodiments, tape 508 may be on the order of a few or several centimeters in length L.

In some embodiments, the entire area A of connector tape 508 may be joined at an interface (not shown) to connector 102. Accordingly, under standard operation in which tapes 104 and 508 are in a superconducting state, current 514 may travel through connector arrangement 500 substantially as depicted in FIG. 5b. In regions of overlap O, where the superconductor tapes 104, 508 may share an interface with connector 102, current may travel substantially within superconductor tapes because of the resistance to current presented by the material of connector 102.

Referring to FIG. 5c, which depicts further details of current flow for connector arrangement 500, in some embodiments, current CF flows into connector 102 only in regions 510, 512 where no tape is disposed on the connector 102. These regions correspond to current path lengths P2 and P3, which may be as little as a few millimeters in some embodiments. Accordingly, the total resistive heating loss may be reduced in connector assembly 500 as compared to assembly 100.

Although assembly 500 may provide reduced current loss, resistive heating may still take place in interfaces in which current passes between superconducting tapes 104, 508 and normal conductor 102, as well as in regions in which the current is entirely within the normal conductor, such as those regions corresponding to P2 and P3, as noted above. In particular, the current may become pinched as it travels between superconductor and normal conductor regions, as illustrated in FIG. 5b. In the embodiment of FIG. 5b, the current 514 may be initially substantially evenly distributed as it travels in a first (y) direction within a first tape 104a. However, the current tends to alter its direction and travel substantially orthogonal to its first direction in a second direction (X) in order to complete its circuit and exit into the second tape 104b. In the configuration of FIG. 5b, the current may exit the tape 104a and become pinched as the current abruptly changes direction. This may lead to increased heating in the pinched regions. It may therefore be desirable to optimize the current flow geometry in the connector portion of an SCFCL assembly to minimize such heating.

FIG. 6 presents one embodiment of a connector assembly 600 in which tapes 604 and connector tape 608 are each mitered. As depicted, the mitered geometry facilitates a more uniform distribution of current 614 as the current exits tapes 604 into connector 602 and enters tape 608 from connector 602. The current may also be more uniformly distributed within tape 608, as depicted.

In some embodiments, the SCFCL arrangements depicted herein, such as connector assemblies 200, 300 may comprise one module of many modules that together function as one SCFCL installation. In one embodiment, an SCFCL installation may comprise about 300 connection points where SC tapes are joined to electrically conductive connectors. As compared to a conventional SCFCL configuration having 300 connection points, the present embodiments may provide about 90% reduction in connection losses. In one embodiment of an SCFCL operating at 138 kV, 3000 A, with 300 copper connection points, the total connection loss may be about 24 W as opposed to about 240 W for the conventional configuration, representing a reduction in about 216 W is steady state power losses.

In summary, SCFCL embodiments disclosed herein provide several benefits that improve the performance of SCFCL technology. By reducing the connection losses, significant reduction in cryogenic cooling costs and maintenance may result. By improving uniformity of current flow, the present embodiments may reduce or eliminate hot spots and thereby the superconductor failure that is induced by such hot spots.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A connector assembly of a superconducting fault current limiter, comprising:
    a first superconducting tape element;
    an electrical connector electrically coupled to the first superconducting tape element at a first region of the electrical connector;
    a second superconducting tape element electrically coupled to the electrical connector in a second region of the electrical connector, wherein the electrical connector comprises a unitary structure, and the first superconducting tape element, the electrical connector, and the second superconducting tape element comprise a layer; and
    a third superconducting tape element disposed between end portions of the first and second superconducting tape elements and having a first planar surface disposed on the electrical connector.

2. The connector assembly of claim 1, the connector assembly comprising a module that includes one or more additional layers arranged as a stack, each additional layer including first and second superconducting tape elements that are electrically coupled to each other through an electrical connector.

3. The connector assembly of claim 1, wherein the electrical connector comprises a unitary body.

4. The connector assembly of claim 1, wherein the electrical connector comprises a highly conductive metal.

5. The connector assembly of claim 1, wherein the electrical connector comprises a U-shaped structure.

6. The connector assembly of claim 2, wherein each superconducting tape element is electrically coupled to a pair of electrical connectors disposed on respective first and second planar surfaces of the tape element.

7. The connector assembly of claim 1, wherein the first and second superconducting tape elements each have an angled edge proximate respective first and second angled edges of the third superconducting tape element, wherein the superconducting tapes mutually define a mitered structure.

8. The connector assembly of claim 1, wherein the superconducting tape elements each comprise a layered structure.

9. The connector assembly of claim 8, wherein the layered structure comprises:
    an inner layer comprising a superconducting material,
    a first outer layer forming a first surface of the superconducting tape element; and
    a second outer layer forming a second surface of the superconducting tape element.

10. The connector assembly of claim 9, wherein the first outer layer is a normal metal having a first electrical conductivity, and wherein the second outer layer is a normal metal having second conductivity that is lower than the first conductivity.

11. A superconducting fault current limiter (SCFCL), comprising:
    a cryogenic cooling system;
    a current limiter module arranged to receive cooling from the cryogenic cooling system and including a stack of layers that form a plurality of parallel current conduction paths, each layer comprising a plurality superconductor tapes arranged in series that are electrically coupled to one another using a unitary metallic connector, wherein a first tape is coupled to the metallic connector in a first region of the connector; and
    a third superconducting tape element disposed on the planar surface of the metallic connector between the end portions of the first and second superconducting tape.

12. The SCFCL of claim 11, wherein each superconductor tape comprises one of: a YBCO tape and a BSSCO tape.

13. The SCFCL of claim 11, wherein the metallic connector comprises a highly conductive metal.

14. The SCFCL of claim 11, wherein a planar surface of an end portion of each of respective first and a second superconducting tape is joined to a planar surface of the metallic connector.

15. The SCFCL of claim 11, wherein the first and second superconducting tapes each have an angled edge proximate respective first and second angled edges of the third superconducting tape, wherein the first through third superconducting tapes mutually define a mitered structure.

16. The SCFCL of claim 11, wherein each superconducting tape comprises a layered structure having:
    an inner layer comprising a superconducting material:
    a first outer layer forming a first surface of the superconducting tape element; and
    a second outer layer forming a second surface of the superconducting tape element.

17. The SCFCL of claim 16, wherein the first outer layer is a normal metal having a first electrical conductivity, and wherein the second outer layer is a normal metal having second conductivity that is lower than the first conductivity.

18. The SCFCL of claim 11, wherein the plurality of superconductor tape are joined in series at a plurality of connection points formed by metallic connectors, wherein the SCFCL is operable to support a voltage in the range of about 100 kV to 200 kV.

* * * * *